(12) United States Patent
Asano

(10) Patent No.: US 7,276,866 B2
(45) Date of Patent: Oct. 2, 2007

(54) MOVING CONTROL APPARATUS AND MOVING CONTROL METHOD

(75) Inventor: Tosiya Asano, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 98 days.

(21) Appl. No.: 11/275,763

(22) Filed: Jan. 27, 2006

(65) Prior Publication Data
US 2006/0170888 A1    Aug. 3, 2006

(30) Foreign Application Priority Data
Jan. 31, 2005 (JP) ............................. 2005-023931

(51) Int. Cl.
*H02K 41/00* (2006.01)
(52) U.S. Cl. ...................... 318/135; 318/567; 318/569
(58) Field of Classification Search ................ 318/135, 318/567, 565, 629, 645, 687, 812, 478; 310/12; 700/42; 355/75
See application file for complete search history.

(56) References Cited

U.S. PATENT DOCUMENTS

| 5,666,038 | A   | 9/1997  | Ohishi ......................... 318/625 |
| 5,684,856 | A   | 11/1997 | Itoh et al. ...................... 378/34 |
| 5,917,580 | A   | 6/1999  | Ebinuma et al. ............... 355/53 |
| 6,442,858 | B1  | 9/2002  | Asano ........................... 33/645 |
| 6,495,847 | B1  | 12/2002 | Asano et al. ................. 250/548 |
| 6,867,849 | B2  | 3/2005  | Iwamoto et al. ............... 355/75 |
| 7,067,942 | B2  | 6/2006  | Korenaga et al. ............. 310/12 |
| 7,154,242 | B2  | 12/2006 | Asano ........................ 318/560 |
| 2004/0112164 | A1 | 6/2004 | Asano et al. ............. 74/490.09 |
| 2005/0248744 | A1* | 11/2005 | Shibazaki ..................... 355/72 |
| 2006/0028310 | A1 | 2/2006 | Asano et al. ................. 335/220 |
| 2006/0082225 | A1 | 4/2006 | Korenaga et al. ............. 310/12 |
| 2006/0170888 | A1 | 8/2006 | Asano ........................... 355/53 |

FOREIGN PATENT DOCUMENTS

| JP | 7-161798    | 6/1995 |
| JP | 3176766     | 4/2001 |
| JP | 2001-175332 | 6/2001 |

* cited by examiner

*Primary Examiner*—Karen Masih
(74) *Attorney, Agent, or Firm*—Fitzpatrick, Cella, Harper & Scinto

(57) ABSTRACT

A moving control apparatus comprising: a moving member provided movably at least in one direction; a driver having a movable element connected to the moving member and a stator to displace the movable element; a controller which energizes the driver to cause the movable element to generate a thrust; a position detector which detects a relative position between the movable element and the stator in the driver; a measurement unit which drives the movable element of the driver and measures an induced voltage generated in the driver; and a correction calculator which calculates a thrust ripple correction value to correct a thrust ripple as a variation of a thrust generated in the driver from the measured induced voltage and the relative position in the driver, and multiplies a command to the driver by the correction value.

13 Claims, 14 Drawing Sheets

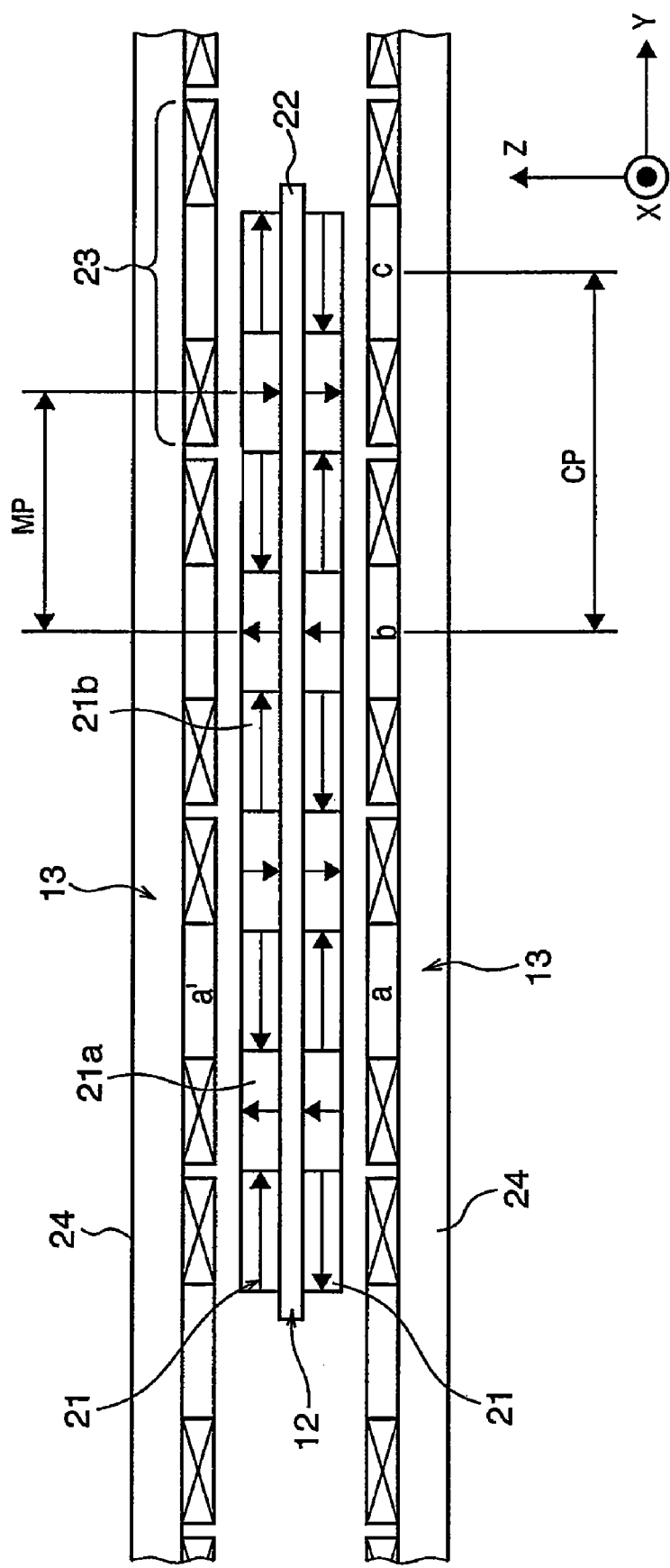

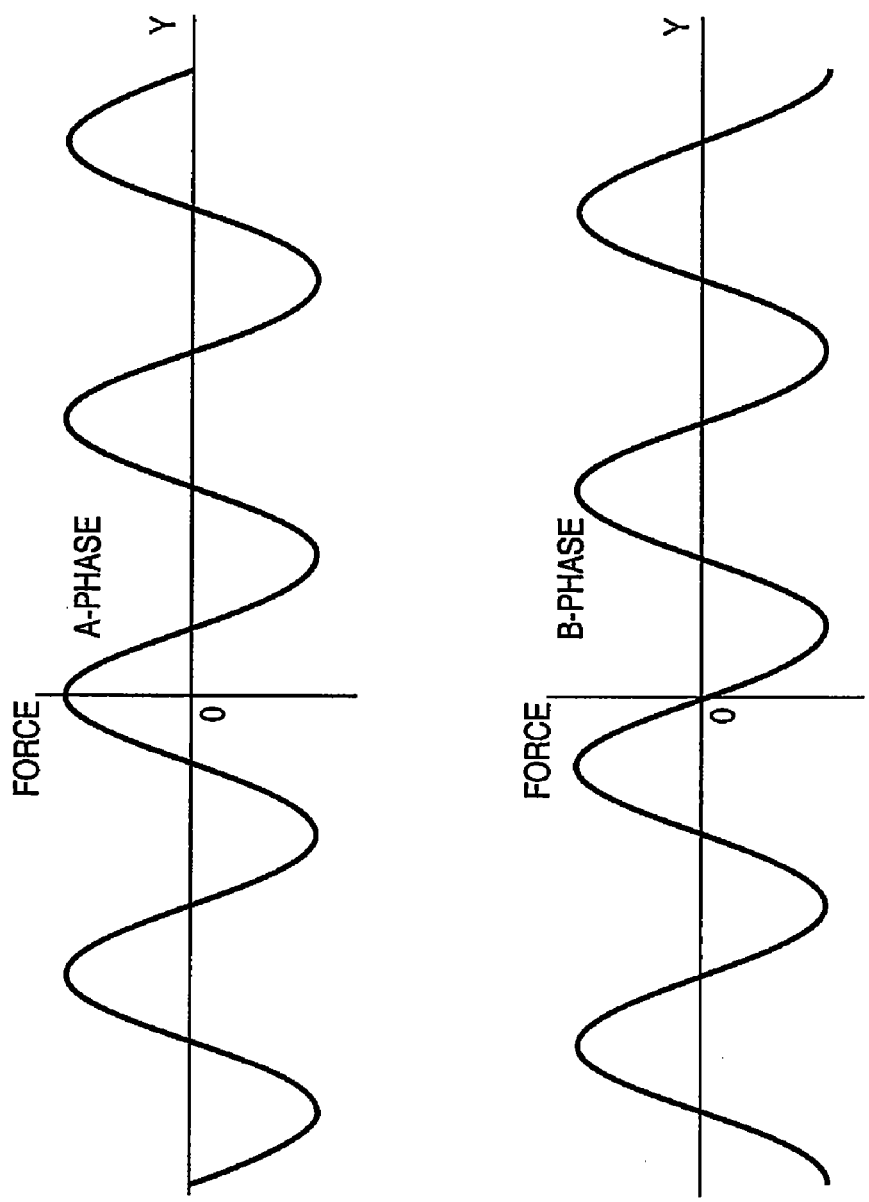

MOVING CONTROL APPARATUS AND MOVING CONTROL METHOD

FIELD OF THE INVENTION

The present invention relates to a moving control technique for positioning an object by moving it.

BACKGROUND OF THE INVENTION

FIG. 12 shows an example of the construction of a stage apparatus and its control system for positioning an object in a semiconductor exposure apparatus, a machine tool or the like (for example, see Japanese Patent No. 3176766).

In FIG. 12, a table top plate 101 is supported with guides 102 movably in leftward and rightward directions of the surface of the drawing. Four movable magnets 105 are arranged on the table top plate 101 such that the polarities of the magnets are alternately changed with respect to a vertical direction of the surface of the drawing. The movable magnets 105 and coils 104 arrayed at equal intervals in a moving direction of the table top plate 101 form a liner motor. The position information of the table top plate 101 in the moving direction is inputted by a position detector 106 and a counter unit 107 into a servo controller 108 and a phase selection controller 109. To solve a positional difference, which is a value obtained by subtracting a position measurement value of the table top plate 101 from a position command to the table top plate 101, the servo controller 108 calculates a control command to the linear motor.

The phase selection controller 109 calculates a rectification value to the respective linear motor coils 104 based on the relative positional relation between the movable magnets 105 and the linear motor coils 104 obtained from the position measurement value of the table top plate 101. A multiplier 119 multiplies the above control command to the linear motor by the above rectification value via a filter circuit 113 and sends the command to the respective current amplifiers 111, to appropriately cause a thrust with the linear motor coils 104, thereby attains position control of the table top plate 101.

A thrust constant of the linear motor is represented with a thrust [N] to a current 1.0 [A] flowing through the coil, as N/A. It is ideal that the thrust constant is constant regardless of the relational position between the coils and the movable magnets, but actually, it is known that the thrust constant varies within a predetermined amplitude. The variation of the thrust constant is called a "thrust ripple". For example, in a case where a 1% thrust ripple exists, the thrust constant, normally 1[N], varies within a range from 0.99 to 1.0 [N] depending on the position.

One of indices representing the performance of a semiconductor exposure apparatus is throughput as the number of processed wafers per hour. To realize high throughput, it is necessary to increase the speed and acceleration upon driving of the stage. As the influence of the thrust ripple is multiplication to the thrust, the error of thrust is increased as the thrust of the linear motor is increased.

Accordingly, when a high thrust is required upon acceleration or deceleration of the stage, the positional deviation of the stage is increased since the actual thrust is extremely shifted from a desired value, and as a result, stabilization time required before the positional deviation of the stage is converged to a predetermined value and exposure becomes possible is increased. The increase in the stabilization time reduces the throughput. Further, in recent years, the use of a scan type exposure apparatus which performs exposure while scanning a reticle stage and a wafer stage in synchronization with each other is a main stream. The wafer is exposed when the reticle stage and the wafer stage are scanned at a constant speed. When the stage is scanned at a constant speed, a high linear motor thrust as in the case of acceleration/deceleration is not required, however, the value of the control command to the linear motor is not zero due to friction resistance at guide members and other disturbance, and the influence of thrust ripple also appears. The influence of thrust ripple upon constant-speed scanning of the stage causes the positional deviation of the stage which becomes a factor of degradation of exposure accuracy. That is, the scan type exposure apparatus is influenced by the thrust ripple upon acceleration/deceleration of stage scanning and upon constant speed stage scanning.

As thrust ripple correction, a method of previously measuring a thrust ripple, then generating a correction table and a correction function based on a stage position, and performing thrust ripple correction upon driving, has been performed. Further, a method for measuring a thrust ripple and generating a correction table and a correction function has been proposed (see Japanese Patent No. 3176766 and Japanese Patent Application Laid-Open No. 7-161798).

In the publication Japanese Patent Application Laid-Open No. 7-161798, a current value of a linear motor used upon actual stage driving is recorded, and a ripple correction table with respect to stage position is generated based on the value, and ripple correction is performed upon exposure driving. Further, upon constant speed driving, as a thrust ripple cannot be observed since the current control command to the linear motor is approximately zero, an external force is applied to produce a current flow through the linear motor. That is, it is necessary to accurately obtain the external force for accurate calculation of thrust ripple. However, there are other external forces to the stage than the external force applied for ripple correction, e.g., a force of the stage's own weight by inclination of the surface of a stage base, a spring force with a cable, air piping to the stage or the like, and the external force cannot be accurately obtained. Even with the method disclosed in the above Japanese Patent Application Laid-Open No. 7-161798, the thrust ripple cannot be accurately obtained. Accordingly, desired stage performance cannot always be attained by thrust ripple correction.

In Japanese Patent Application Laid-open No. 2001-175332, a correction function is generated from data upon actual stage driving. More specifically, parameters are set respectively for a thrust ripple due to occurrence of a driving force for a stage driving amplifier, a thrust ripple due to viscosity of the linear motor, and a thrust ripple having a constant amplitude characteristic of the linear motor. The parameters are estimated by an adaptation mechanism. The above three types of items include a thrust ripple other than the thrust ripple in real meaning as variation of thrust constant dependent on the stage position. In the method using data upon actual stage driving, it is necessary to obtain a thrust ripple from a control command including all the disturbances. Accordingly, the number of estimation parameters is increased, and it is difficult to accurately obtain a thrust ripple.

As described above, it is desired to accurately measure a pure thrust ripple for generation of a thrust ripple correction table.

Further, generally, to prevent breakage of the stage, the linear motor and the current driver, in calculation by the control system, a command value to the current driver is limited with an upper value and a lower value. When the command to the current driver before correction is almost the limit value and a correction regarding the thrust ripple is performed on the command to the current driver, the command to the current driver exceeds the limit value by multiplication by a correction value. A thrust ripple correction method for reliable convergence of command to the current driver between the limitation values is needed.

Further, it is convenient for the sake of accuracy that the measurement of thrust ripple is performed in a status where the linear motor is incorporated in the exposure apparatus. Accordingly, a structure to perform thrust ripple measurement in a status where the linear motor is incorporated in the apparatus is desired.

Further, a linear motor having the simplest structure using one stator and one movable element is widely used. Also, a thrust ripple measurement method with a simple structure applicable to this linear motor is desired.

Further, for reduction of exposure apparatus assembly time, a linear-motor thrust ripple correction table may be obtained before the linear motor is incorporated in the exposure apparatus. Further, a method for measuring a thrust ripple before the motor is incorporated in the exposure is needed.

Further, recently, it is conceivable that the number of coils used in an exposure apparatus is increased from conventional several tens to several hundreds due to increase in a stage stroke by use of large wafer diameter (300 mm), adoption of a twin stage system having two stages in one exposure apparatus, or the like.

Further, upon checking trouble of coils or breakage of wirings to the coils, it is not efficient to check the coils one by one. Accordingly, a method for efficiently checking the coils and coil wirings is needed.

SUMMARY OF THE INVENTION

The present invention has been made in consideration of the above problems, and has its object to accurately measure a thrust ripple and correct it.

To address the above problems and attain the object, he present invention provides a moving control apparatus comprising: a moving member provided movably at least in one direction; a driver having a movable element connected to the moving member and a stator to displace the movable element; a controller which energizes the driver to cause the movable element to generate a thrust; a position detector which detects a relative position between the movable element and the stator in the driver; a measurement unit which drives the movable element of the driver and measures an induced voltage generated in the driver; and a correction calculator which calculates a thrust ripple correction value to correct a thrust ripple as a variation of a thrust generated in the driver from the measured induced voltage and the relative position in the driver, and multiplies a command to the driver by the correction value.

Further, the present invention provides a moving control method for a moving control apparatus, having a moving member provided movably at least in one direction and a driver having a movable element connected to the moving member and a stator to displace the movable element, wherein the driver is energized to cause the movable element to generate a thrust, comprising: a position detection step of detecting a relative position between the movable element and the stator in the driver; a measurement step of driving the movable element of the driver and measuring an induced voltage generated in the driver; and a correction calculation step of calculating a thrust ripple correction value to correct a thrust ripple as a variation of a thrust generated in the driver from the measured induced voltage and the relative position in the driver, and multiplies a command to the driver by the correction value.

Further, the present invention provides an abnormality detection apparatus comprising: a moving member provided movably at least in one direction; a driver having a movable element connected to the moving member and a stator to displace the movable element; a controller which energizes the driver to cause the movable element to generate a thrust; a measurement unit which drives the movable element of the driver and measures an induced voltage generated in the driver; and a detector which detects an abnormality using the result of measurement by the measurement unit.

Further, the present invention provides an abnormality detection method for an apparatus, having a moving member provided movably at least in one direction and a driver having a movable element connected to the moving member and a stator to displace the movable element, and a controller which energizes the driver to cause the movable element to generate a thrust, comprising: a measurement step of driving the movable element of the driver and measuring an induced voltage generated in the driver; and a detection step of detecting an abnormality using the result of measurement at the measurement step.

Note that an exposure apparatus which uses the above moving control apparatus for relatively positioning an original plate and a substrate and exposing them, and a device fabrication method for fabricating a device using the exposure apparatus, are included in an applicable scope of the present invention.

According to the present invention, a thrust ripple can be accurately measured and corrected.

Further, according to the present invention, an abnormal state or trouble such as coil breakage or its positional shift, magnet demagnetization or its positional shift, can be efficiently detected by utilizing the induced voltage.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a cross-sectional view showing the structure of a liner motor;

FIGS. 5A and 5B are graphs showing the relation between a force generated upon appropriately selecting energization of the coils and the position;

DETAILED DESCRIPTION OF THE PREFERRED EMBODIMENTS

Hereinbelow, preferred embodiments of the present invention will now be described in detail in accordance with the accompanying drawings.

Note that the embodiments to be described below show merely examples of implementation of the present invention, and they can be appropriately modified or changed in accordance with construction of apparatus to which the present invention is applied or various conditions.

Further, the present invention is applicable to, as well as a device fabrication apparatus to be described below, various machine tools, high-precision processing apparatuses and various precision measuring equipments, and a method for fabrication of semiconductor device using the device fabrication apparatus.

Further, the object of the present invention can also be achieved by providing a storage medium (or recording medium) holding software program code for realizing a ripple correction method, a device fabrication method and the like to be described as embodiments to a system or an apparatus, reading the program code with a computer (e.g., CPU, MPU) of the system or apparatus from the storage medium, then executing the program.

First Embodiment

Figure 1:
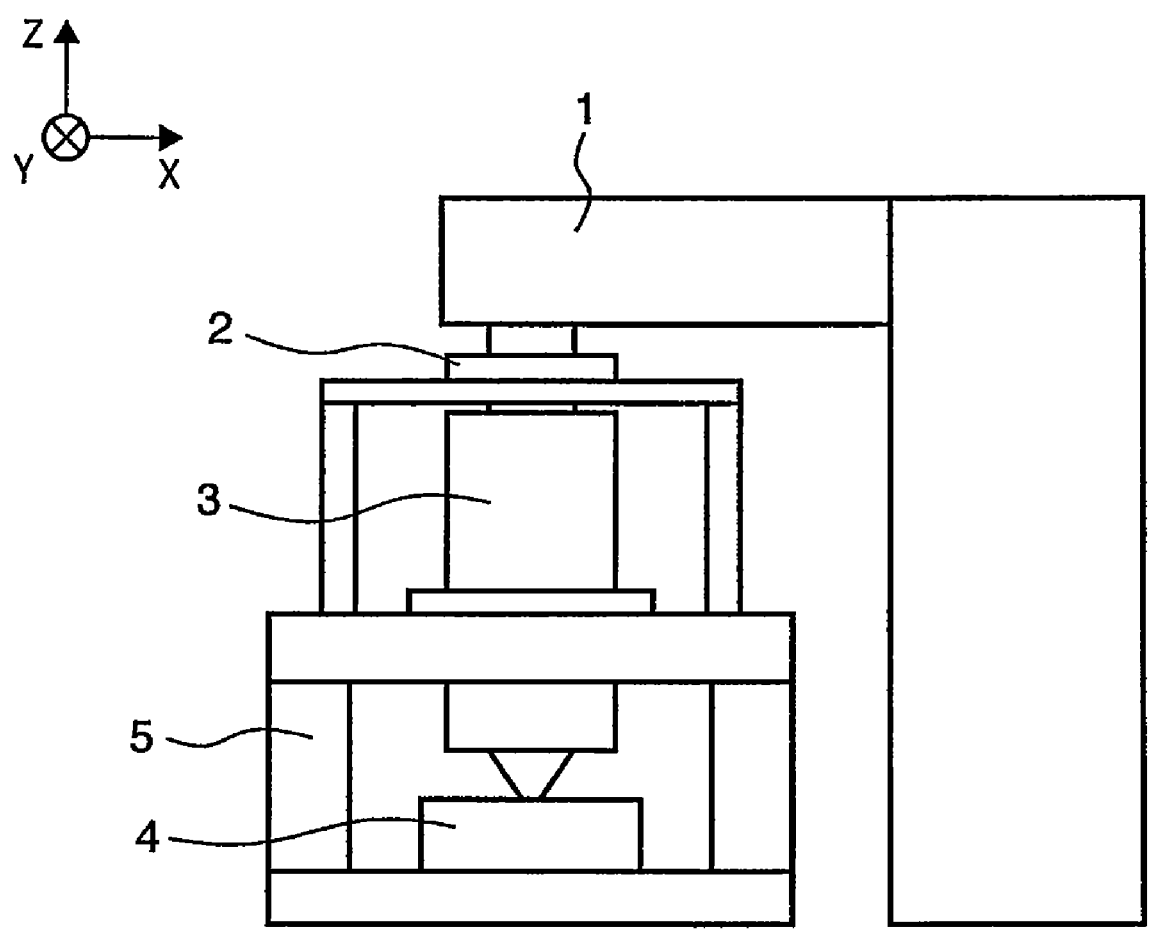
FIG. 1 is a schematic side view showing a construction of an exposure apparatus for semiconductor device fabrication as an embodiment of the present invention.
Figure 2:
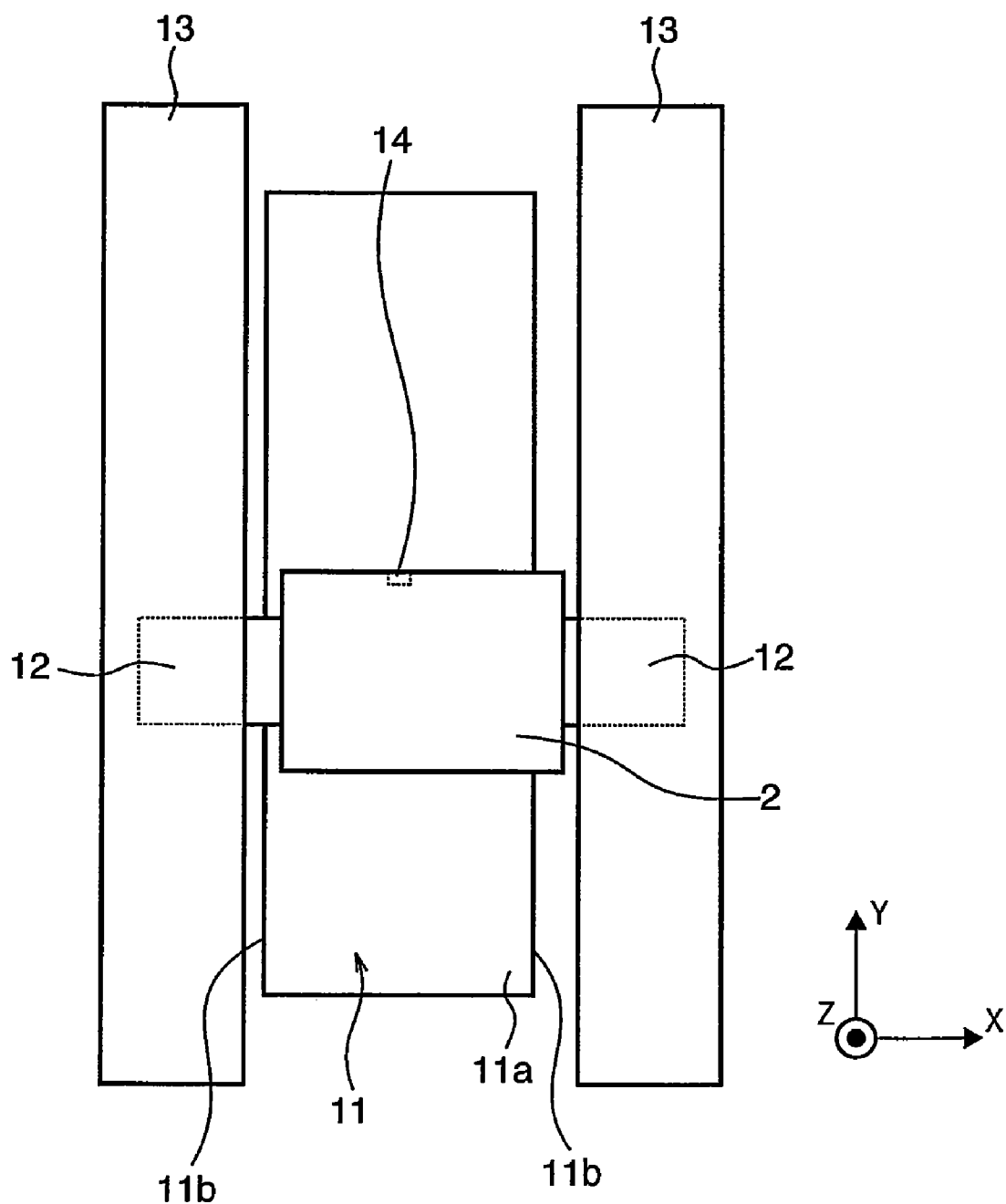
FIG. 2 is a top view showing a schematic structure of a reticle stage mounted in the exposure apparatus in FIG. 1.

FIG. 1 is a schematic side view showing a construction of an exposure apparatus for semiconductor device fabrication as a preferred embodiment of the present invention. FIG. 2 is a top view showing a schematic structure of a reticle stage mounted in the exposure apparatus in FIG. 1.

In FIG. 1, the exposure apparatus of the present embodiment has an illumination apparatus 1, a reticle stage 2 carrying a reticle, a projection optical system 103, a wafer stage 4 carrying a wafer, and an exposure apparatus main body 5. The exposure apparatus projection-exposes a circuit pattern formed on the reticle (original plate) to the wafer (substrate). For example, a step and repeat projection exposure method or a step and scan projection exposure method is employed.

The illumination apparatus 1, having a light source unit and an illumination optical system, illuminates the reticle where a circuit pattern is formed. In the light source unit, laser for example is used as a light source. As the laser, ArF excimer laser having a wavelength of about 193 nm, KrF excimer laser having a wavelength of about 248 nm, F2 excimer laser having a wavelength of about 153 nm, or the like, is used, however, the laser type is not limited to excimer laser. For example, YAG laser may be used. Further, the number of lasers is not limited. When laser is used in the light source unit, it is preferable to use a light beam shaping optical system to shape a collimated light beam from the laser light source to a desired beam shape and an incoherent optical system to convert a coherent light beam to an incoherent light beam. Further, a light source available as the light source unit is not limited to the laser, but a single or plural lamps such as mercury lamps and xenon lamps can be used. The illumination optical system including a lens, a mirror, a light integrator, an aperture and the like, is used for illumination of the reticle.

As the projection optical system 3, an optical system having only plural lens elements, an optical system having plural lens elements and at least one concave mirror (catadioptric optical system), an optical system having plural lens elements and at least one diffraction optical element such as a kinoform, or a full reflecting mirror type optical system can be employed.

The exposure apparatus having the above construction can be utilized in fabrication of a semiconductor device where a fine pattern is formed such as a semiconductor integrated circuit, a micro machine and a thin film magnetic head.

Next, the schematic structure of the reticle stage 2 will be described.

In FIG. 2, the reticle stage 2 is supported in a non-contact manner with a stage base 11 having a mirror-finished upper surface 11a as a reference surface via a hydrostatic guide bearing (not shown). The hydrostatic guide bearing has high rigidity. The displacement of the reticle stage 2 in a Z-direction and a swinging direction (a rotational direction about an X-axis or a Y-axis) with respect to the stage base 11 is regulated (the reticle stage is restrained from moving in the direction). The displacement of the reticle stage 2 is enabled only along a horizontal plane as an X-Y direction.

The stage base 11 has side surfaces (yaw guide surfaces about a Z-axis) 11b which are also mirror-finished. The displacement of the stage in the X-direction and a θz direction as a rotational direction about the Z-axis is regulated. Accordingly, the reticle stage 2 can be moved only in the Y-axis direction on the stage base 11, and the displacements in the other directions are regulated with the rigidity of the hydrostatic guide bearing (the reticle stage is restrained from moving in the directions).

The reticle stage 2 is provided with a pair of movable element units 12 on left and right sides in the Y-axis direction. The respective movable element units 12 form a left linear motor and right linear motor in cooperation with respectively corresponding stator units 13. The structure of the linear motor will be described later.

The stage base 11 and the left and right stator units 13 are supported with a reference base (not shown). The reticle stage 2 is provided with a reflecting mirror 14 to reflect a measuring light from a laser interferometer (not shown) for measurement of displacement or moved position of the reticle stage 2 in the Y-axis direction.

A control value, from a controller to be described later (see FIG. 7) using a well-known PID, to supply a thrust to the linear motor, is generated with a position command of the reticle stage 2 from an apparatus control system (not shown) and stage position information measured by the laser interferometer. The linear motor generates a driving force in the Y-axis direction by appropriately passing a current to coils with a current driver to be described later (see FIG. 7), to drive the reticle stage 2, thereby achieve position control. The reticle stage 2 carries the reticle (original plate) (not shown). Exposure light from the illumination optical system 1 passes through the reticle, thus exposure to the wafer (substrate) on the wafer stage 4 (not shown) is performed via a reduced projection optical system 3.

FIG. 3 is a cross-sectional view showing the structure of the liner motor.

The movable element unit 12 has a magnet unit 21 as a magnet group of plural permanent magnets and a movable element plate 22 to hold the magnet unit 21 and attach the unit to the stage surface. The magnet unit 21 has eight main pole magnets 21a where the orientation of the magnetic pole is in the Z direction and ten sub pole magnets 21b where the orientation of the magnetic pole is in the Y direction. The magnetic pole orientations of the main pole magnets 21a are alternately opposite via the sub pole magnet 21b, and arranged in the Y-direction at equal intervals. The sub pole magnets 21b are set in an orientation such that the polarity of a portion of each main pole magnet 21a facing the coil 23 is repelling the sub pole magnet 21b and a magnetic flux from the main pole magnet 21a can be efficiently utilized. In the stator unit 13, the coils 23 are arranged at equal intervals in the Y-direction on yokes 24 of ferromagnetic material such that the coils 23 hold the movable element unit 12 from upper and lower positions. The pitch MP of the main pole magnet 21a and the pitch CP of the coil 23 is in the relation as represented by the following expression (1).

$$CP=1.5*MP \qquad (1)$$

The upper and lower coils, e.g., coils a and a' are serially connected such that the currents flow through the coils in the same direction, and are driven with one current driver. However, it may be arranged such that these coils are not serially connected and are driven with different drivers. Note that in the following description, the upper and lower coils are serially connected.

Figure 4A:
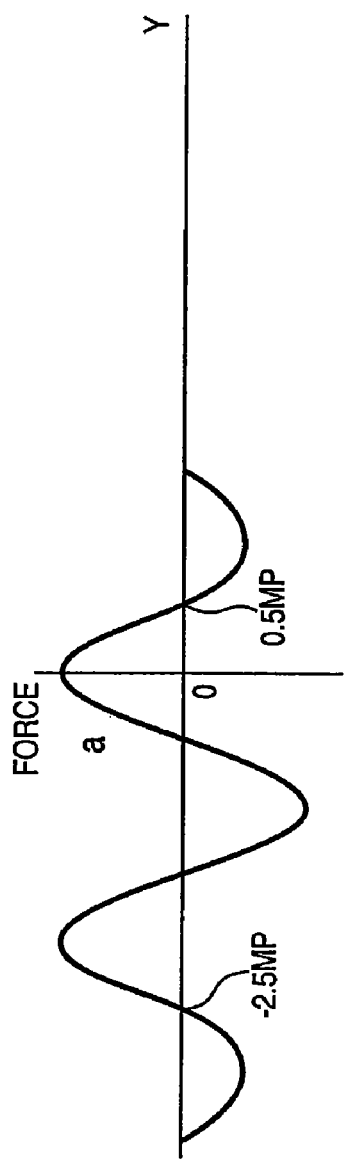
FIGS. 4A to 4C are graphs showing the relation between a force applied to movable elements and a position when a constant current is passed through coils.
Figure 4B:
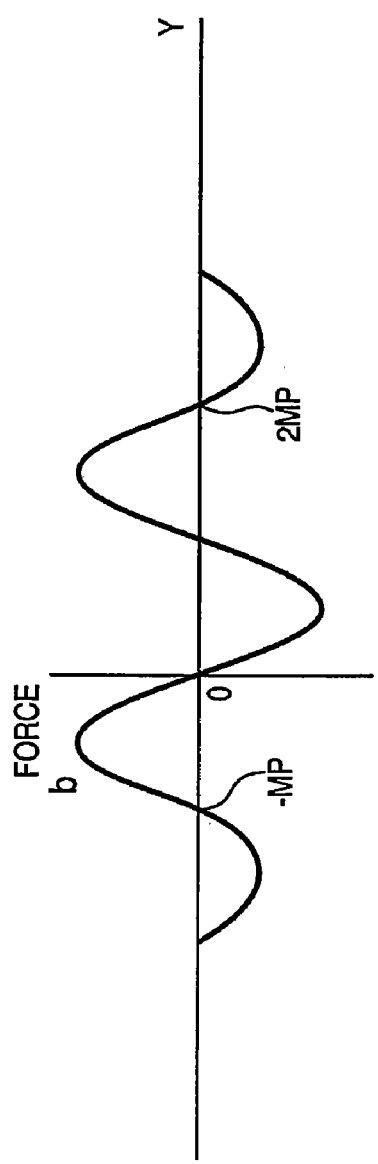
Figure 4C:
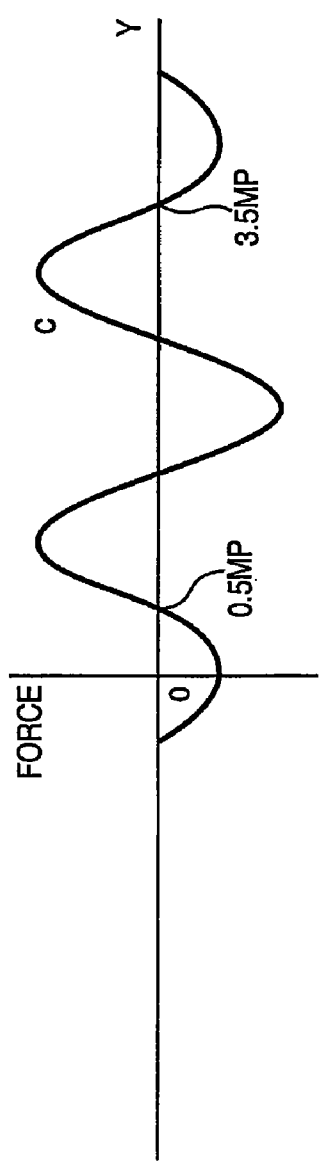

FIGS. 4A to 4C respectively show a force applied to the movable element unit 12 from the respective coils when a predetermined current is passed through the respective coils a to c in FIG. 3 in the same direction and the movable element unit 12 is moved in the Y-axis direction.

In the coil a, the applied force is an approximately sine wave force between −2.5 MP and 0.5 MP, then, before −2.5 MP and after 0.5 MP, the force is reduced since only a part of the coil faces the magnet of the movable element unit 12. In the coil b, the applied force is an approximately sine wave between −MP and 2 MP, and the phase is shifted by 90° from that of the coil a. In the coil c, the applied force is appropriately a sine wave between 0.5 MP and 3.5 MP, and the phase is shifted by 180° from that of the coil a. In the coils a and c, it can be arranged such that a current is passed through the coil a before 0.5 MP, then a current in the opposite direction to the previous current is passed through the coil c from 0.5 MP, thereby an approximately sine wave is continuously generated. At this time, if one current driver is used, the coils a and c, in opposite orientations, are connected, and a current is passed through only one of the coils using a selection switch in correspondence with positional relation between the coil and the magnet, it is not necessary to provide current drivers for the respective coils. Similarly, when a current is passed through the coils alternately in opposite directions at 3MP intervals, an approximately sine wave force can be continuously generated. Similarly, if a current is passed through the coil b as a representative coil and its alternate subsequent coils, an approximately sine wave force can be continuously generated as shown in FIGS. 5A and 5B. The coil group represented by the coil a will be called an "A-phase", and the coil group represented by the coil b, a "B-phase". Assuming that the waveforms in FIGS. 5A and 5B are sine waves, when a current 1[A] is passed selectively through the A-phase and B-phase coil groups in correspondence with the position, the generated thrust forces fa and fb with respect to a movable element position y are $$fa = K*\cos(\omega*y) \qquad (2)$$

$$fb = K*\sin(\omega*y) \qquad (3)$$

$\omega = 2\pi/(2MP)$

K: a constant

When a command current I to be passed through the A-phase and the B-phase is multiplied by rectification values ca and cb, and then the current is passed through the coils, $$ca = \cos(\omega*y) \qquad (4)$$

$$cb = \sin(\omega*y) \qquad (5)$$

The resultant force F from the A-phase and B-phase currents is $$\begin{aligned}F &= K*\cos(\omega*y)*I*\cos(\omega*y) + \\ &\quad K*\sin(\omega*y)*I*\sin(\omega*y) \\ &= K*I*(\cos^2(\omega*y) + \sin^2(\omega*y)) \\ &= K*I\end{aligned} \qquad (6)$$

Figure 6:
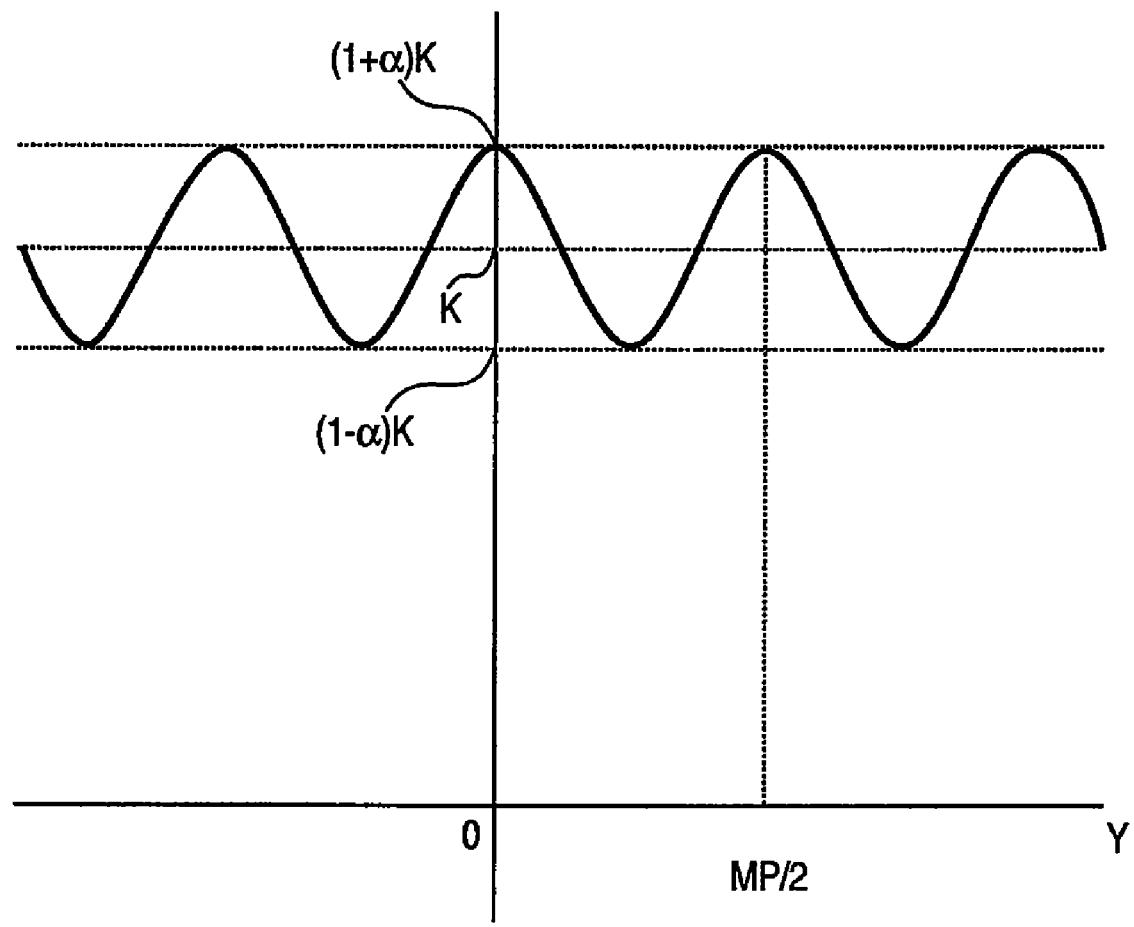
FIG. 6 is a graph showing an example of a thrust ripple due to magnets.

The resultant force is proportional to the current I regardless of the position y of movable element. The proportionality constant K is called a thrust constant (unit: N/A). Note that the expression (6) holds only on the assumption that the waveforms in FIGS. 5A and 5B are sine waves. Actually, the waveforms are not ideal sine waves as in the expressions (2) and (3) due to positional shift upon magnet assembly, shift of magnetic characteristic of the magnet itself or the like. Accordingly, the value K in the expression (6) is not constant. Generally, thrust unevenness due to magnet shift or the like has a period MP/2 as shown in FIG. 6. The thrust unevenness will be called a thrust ripple, and "□" in FIG. 6, a ripple rate. Further, assuming that a very ideal magnet has been formed and the expressions (2) and (3) hold, when the A-phase coil position is shifted by +d, the expression (4) becomes $$ca = \cos(\omega*(y-d)) \qquad (4)'$$

Also, the value K in the expression (6) is not constant. In this manner, two types of thrust ripples, i.e., the thrust ripple by the magnet and the thrust ripple by the coil, exist. As the accuracy in coil positioning can be increased, the thrust ripple is caused mainly by the magnet.

Figure 7:
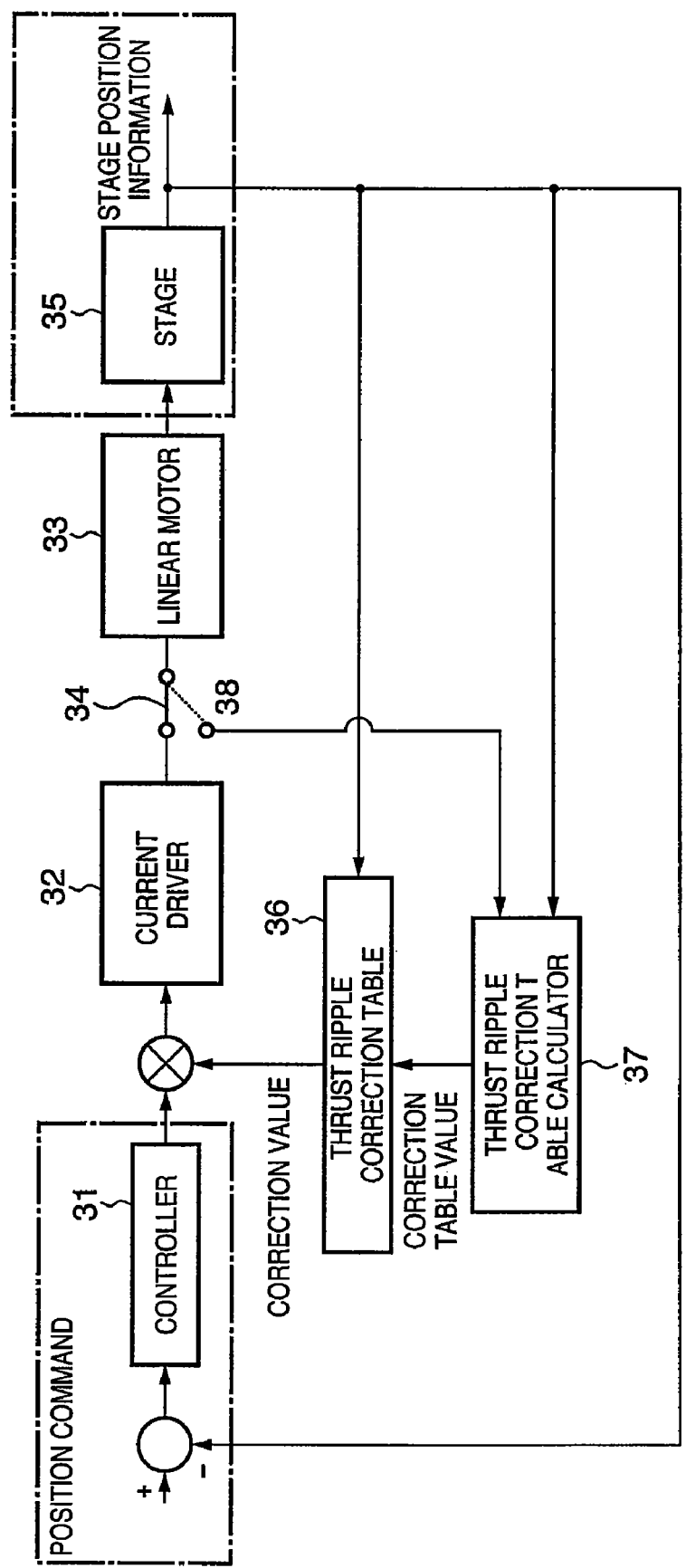
FIG. 7 is a block diagram of a stage control system according to the embodiment of the present invention.

FIG. 7 is a block diagram of a stage control system according to the embodiment. In FIG. 7, a current driver 32, a linear motor 33, a selection switch 34, a thrust ripple correction table 36, a thrust ripple correction table calculator 37, and an induced voltage inlet 38 are provided in the left and right linear motors. Blocks indicated with an alternate long and short dash line, i.e., a controller 31 and a stage 35 are common elements in the left and right linear motors.

Figure 8:
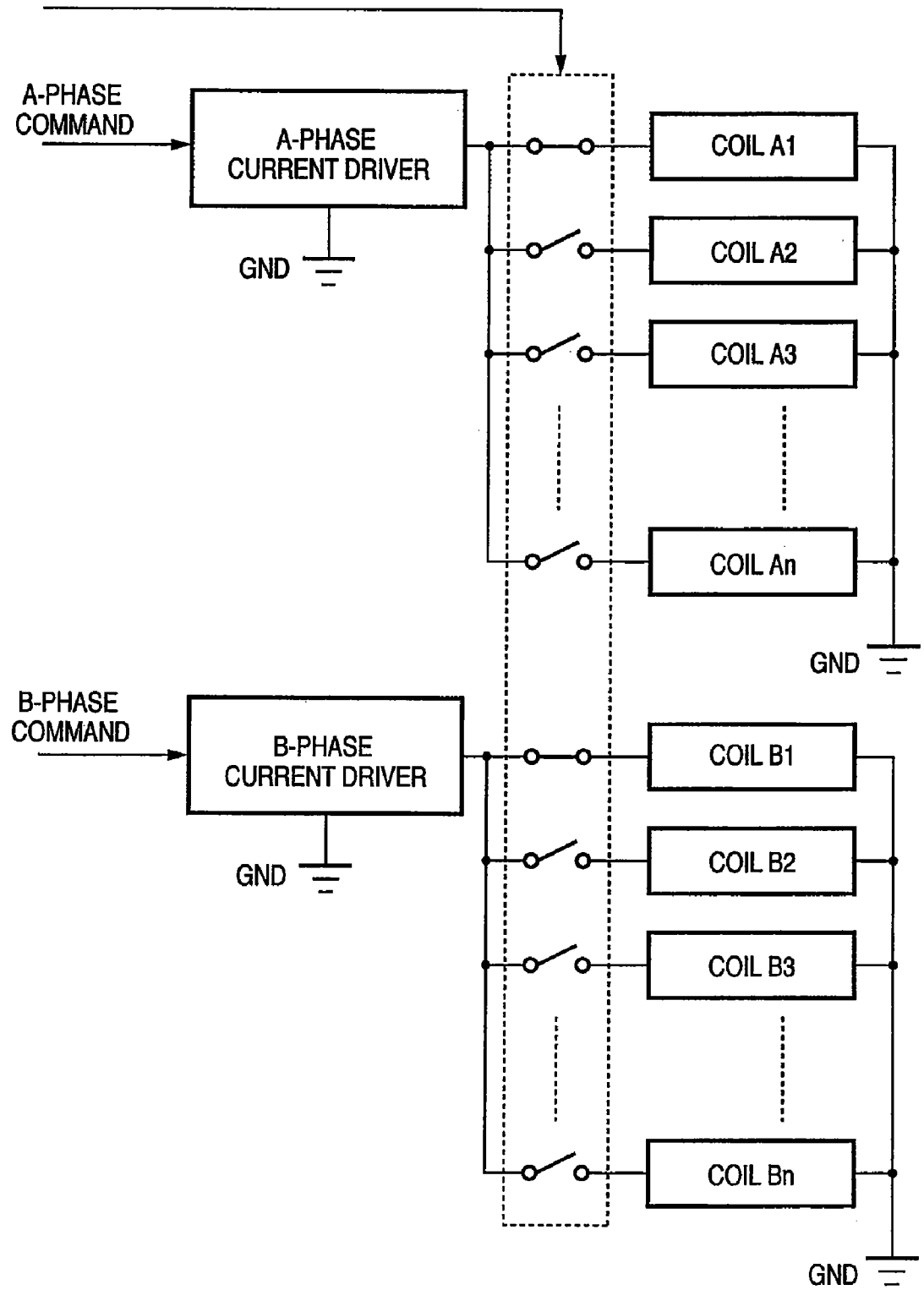
FIG. 8 is a block diagram showing an example of a coil selection circuit.

Further, a coil selection circuit as shown in FIG. 8 is incorporated in the linear motor 33 in FIG. 7. As described above, the coil selection circuit selects one of the A-phase coils and one of the B-phase coils and connects the selected coils to the current driver based on a coil selection command in correspondence with the positional relation between the coils and magnets. In FIG. 8, coils A1 and B1 are selected. The number of the A-phase coils is An, and that of the B-phase coils, Bn (n is a natural number). These numbers of coils are determined based on a coil pitch and a necessary stage stroke.

Figure 9:
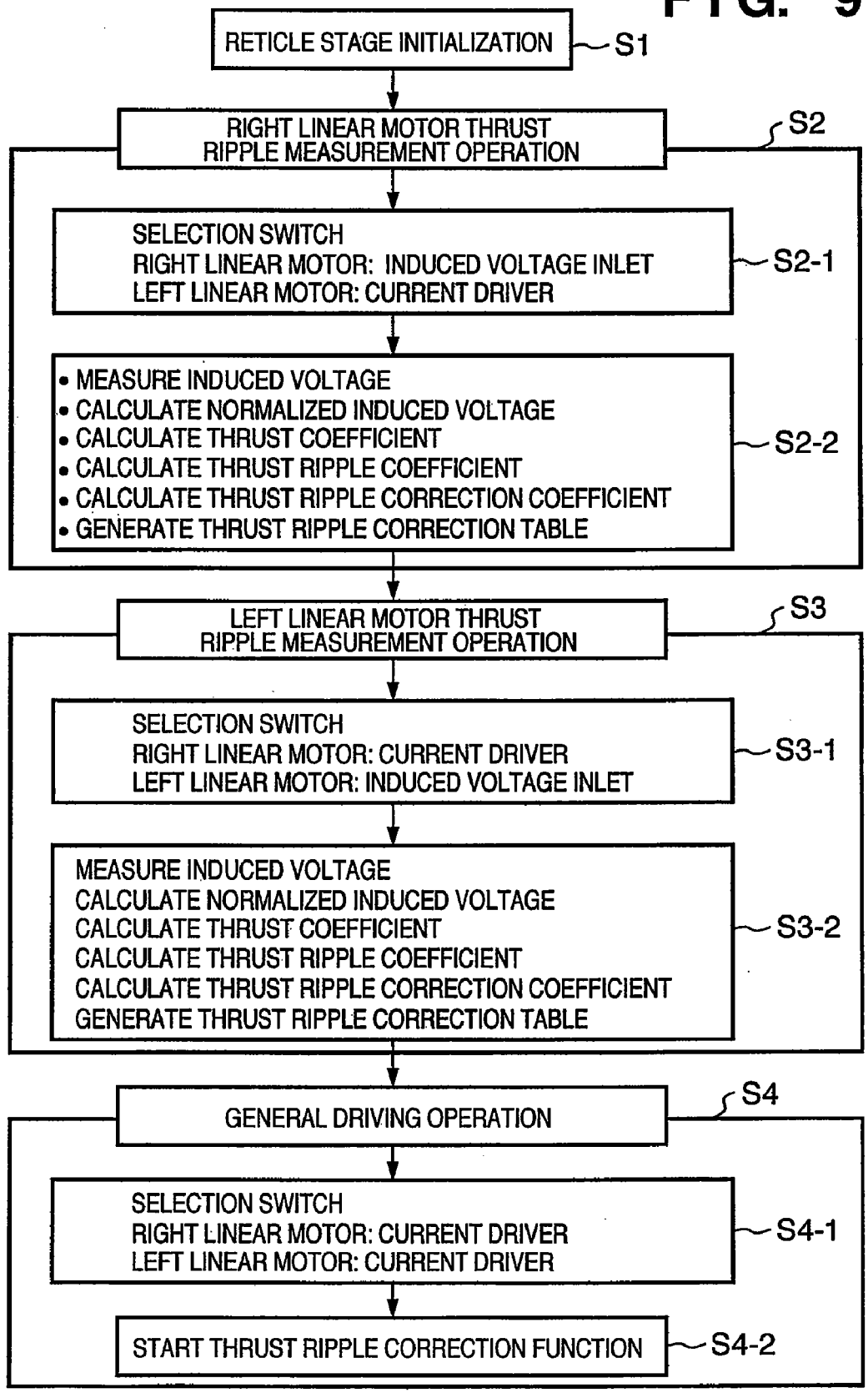
FIG. 9 is a control sequence diagram according to the embodiment of the present invention.

Next, the control operation will be described with reference to the sequence in FIG. 9.

S1 A general initialization operation is performed. At this time, the selection switch 34 in FIG. 7 is connected to the current driver 32 side. By the initialization operation, initialization of the laser interferometer and reticle original point detection are completed, and then a position servo system is enabled to function to drive the reticle stage to an arbitrary position.

S2 (S2-2) Next, a thrust ripple measurement operation in the right linear motor is performed. At this time, the selection switch 34 in FIG. 7 of the right linear motor is connected to the induced voltage inlet 38, while the selection switch 34 of the left linear motor is connected to the current driver 32 side.

S2-2 As the reticle stage is driven only with the left linear motor, when a high accelerating/decelerating force is outputted, a θz moment occurs. Accordingly, the reticle stage is driven with a low acceleration that the hydrostatic guide bearing in the θz direction can sufficiently bear. Then, the reticle stage is moved to a stroke limit on the Y minus side. Next, the reticle stage is moved at a constant speed to a stroke limit on the Y plus side, and the induced voltage generated in the coils on the right linear motor side is measured by each of the A-phase and the B-phase.

It is desirable that the stage control system performs digital signal processing. The induced voltage is inputted through an AD (analog-digital) converter into a digital calculator. At this time, stage position information and stage speed information are also obtained. The stage speed may be calculated from a difference between time discrete position measurement values. When the stage speed is increased, the induced voltage is increased, and might exceed the upper limit of an input value to the AD converter. Accordingly, the stage speed is appropriately set such that the induced voltage does not exceed the upper limit of the AD converter and obtain a good S/N ratio.

Next, the induced voltage will be described.

Assuming that the mass of the stage is m[kg], the stage speed, v[m/s], the induced voltage, V[V], and a current which flows by the induced voltage upon closing of the coil, I[A], the following expression (7) holds from the relation of energy.

$$d/dt(½*mv^2)=VI \quad (7)$$

The expression (7) is deformed to $$dv/dt(vm)=VI \quad (7')$$

On the other hand, from the motion equation, as a force F[N], the following expression (8) holds.

$$dv/dt(m)=F \quad (8)$$

The relation between the current I flowing through the coil and the force F applied to the stage is expressed using the coefficient K, $$F=K*I \quad (9)$$

Then from the expressions (7)' (8) and (9), the following expression (10) is obtained.

$$dv/dt(vm)=v*F=v*K*I=V*I \quad (10),$$

then the following expression (11) holds.

$$K=V/v \quad (11)$$

Accordingly, the coefficient K can be represented with the induced voltage and the stage speed v at that time. A value obtained by dividing the induced voltage by the stage speed v at that time will be called a normalized induced voltage. Respective A-phase and B-phase normalized induced voltages Va and Vb are calculated by dividing the A-phase and B-phase induced voltages by the stage speed. The thrust coefficient K as a linear motor is obtained by multiplying the respective phase normalized induced voltages by the rectification values ca and cb in the expressions (4) and (5) and summing the results.

The thrust coefficient K includes no disturbance force applied to the stage. Further, as the coefficient is calculated based on the induced voltage measured by actual interaction between the magnets and the coils, the constant is a pure linear motor thrust coefficient. A value obtained by diving the coefficient K by a K mean value Km will be called a thrust ripple coefficient. A reciprocal of the thrust ripple coefficient is obtained, and will be called a thrust ripple correction coefficient.

Figure 10A:
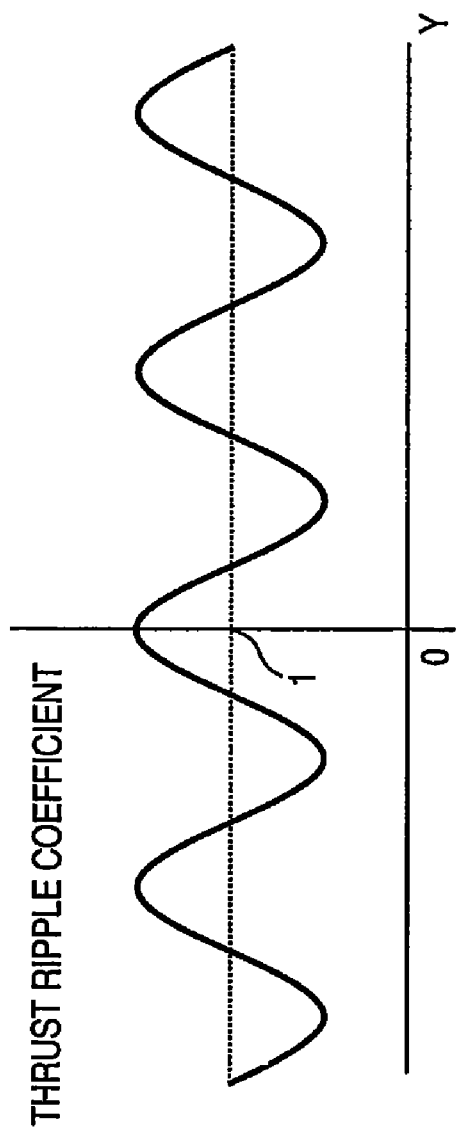
FIGS. 10A and 10B are graphs showing examples of the thrust ripple coefficient and a corresponding thrust ripple correction coefficient.
Figure 10B:
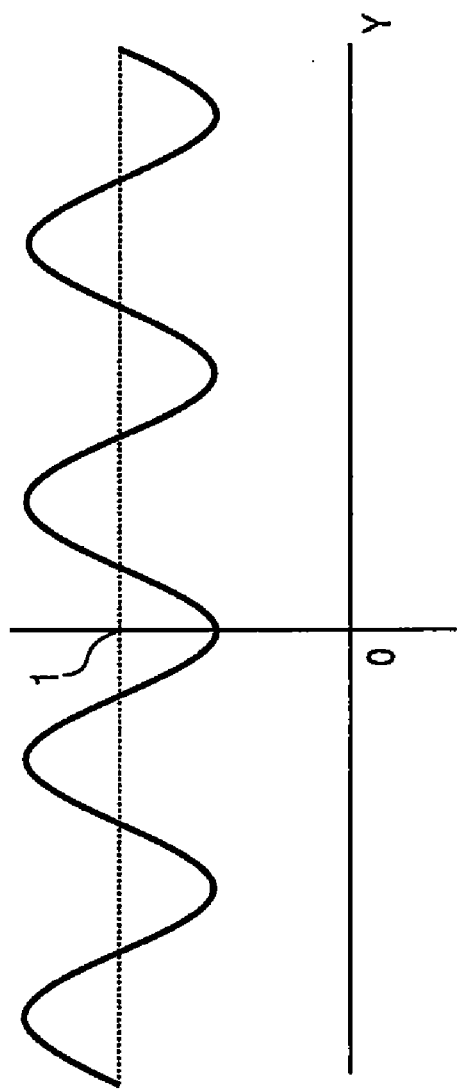

FIGS. 10A and 10B are graphs showing examples of the thrust ripple coefficient and a corresponding thrust ripple correction coefficient. When the thrust ripple coefficient is multiplied by the thrust ripple correction coefficient, the result is "1.0". Then, the thrust ripple correction table 36 in FIG. 7 is generated using the thrust ripple correction coefficient. As the stage position information is used as an argument in the thrust ripple correction table 36, the accuracy is increased as the table is generated at fine intervals. However, in the exposure apparatus, the memory capacity is limited. Accordingly, it is preferable that a correction table value is generated by a several tenth to hundredth part of the period of the thrust ripple, and the table value is interpolated using a well-known interpolation method, thereby a correction value is calculated. The thrust ripple correction table 36 holding the correction values generated as above is stored in the memory of the exposure apparatus.

FIG. 7 conceptually shows the function of the thrust ripple correction table calculator 37 to generate the thrust ripple correction table 36 from the induced voltage data. The calculator having this function may be provided in the exposure apparatus, or the thrust ripple correction table may be generated by another calculator and duplicated into the memory of the exposure apparatus.

S3 (S3-1 and S3-2) Next, the selection switch 34 shown in FIG. 7 of the right linear motor is connected to the current driver 32 side, while the selection switch 34 of the left linear motor is connected to the induced voltage inlet 38 side. Then the thrust ripple correction table for the left linear motor is generated by the same procedure as above.

S4 Next, the selection switches 34 of the left and right linear motors are connected to the current driver 32 side (S4-1). When the thrust ripple correction table calculator 37 starts to function, interpolation is appropriately performed and a correction value is obtained from the thrust ripple correction table based on the stage position information (S4-2).

The thrust ripple correction table 36 performs correction by multiplying the command value from the controller 31 to the current driver 32 by the correction value and sends the command value to the current driver 32. By this correction, regardless of the position Y of the reticle stage, the linear motor behaves as if it has the thrust constant Km having a constant value as its thrust characteristic. As described above, two type of thrust ripples caused by the magnet and by the coil exist in the linear motor, and in other words, if demagnetization of the magnet or its positional shift, or the positional shift of the coil does not occur, the thrust ripple does not change. Accordingly, once the thrust ripple correction table is generated upon starting of the apparatus, the same table can be used. When the apparatus has been used many years and the influence of demagnetization of the magnet or the like appears, the thrust ripple correction table 36 can be generated again by the above procedure.

[Modification]

Note that as a modification of the above embodiment, upon calculation of the thrust ripple correction coefficient from the thrust ripple coefficient, the thrust ripple coefficient may be divided by a minimum value Kmin of the thrust ripple coefficient in place of the mean value Km. In this case, the thrust ripple coefficient is equal to or greater than "1.0", and the thrust ripple correction coefficient as a reciprocal is equal to or less than "1.0", and the correction value obtained from the thrust ripple correction table is equal to or less than "1.0".

Generally, to prevent breakage of the stage, the linear motor and the current driver, in calculation in the control system, a command value to the current driver is limited with upper and lower limit values. In a case where the command to the driver before correction is almost the upper limit value, when the correction value obtained from the thrust ripple correction table exceeds "1.0", the command to the current driver exceeds the limit value by multiplication by the correction value. In a case where the correction value obtained from the thrust ripple correction table is equal to or less than "1.0", the command to the current driver can be reliably converged between the limit values by managing the command to the current driver before correction.

In the above embodiment, as described in FIG. 3, in the upper and lower coil units, the pair of upper and lower coils are serially connected, however, it may be arranged such that the coils are not serially connected but the current drivers are respective provided as described above. In such case, a thrust ripple correction table for right upper linear motor, a thrust ripple correction table for a right lower linear motor, a thrust ripple correction table for a left upper linear motor and a thrust ripple correction table for a left lower linear motor are provided, and the thrust ripples are respectively corrected.

Further, in the reticle stage in FIG. 2, the left and right stator units are fixed to the reference base, however, not to transmit the reaction force from the linear motor to the reference base, it may be arranged such that the stator units are movable in the Y-axis direction. In this case, as the coils in the stator units move, the positions of the stator units as well as the position of the reticle stage are measured. The positional relation between the movable element magnets and the coils is calculated from the respective measurement values. Then the generation of the thrust ripple correction table and the calculation of the correction value form the thrust ripple correction table are performed.

Further, in the present embodiment, the magnet is employed as the movable element, and the coil, as the stator, however, the members of these elements may be exchanged. In a linear motor having a coil as a movable element and a magnet as a stator, the advantages of the present invention can be attained. In this case, as it is not necessary to selectively change the coil, the coil selection circuit in FIG. 8 can be omitted.

Further, as a linear motor, the magnet is held between the coils, however, other structures may be employed. For example, as disclosed in the above Japanese Patent No. 3176766, the coil may be held between the magnets.

Further, the linear motor has a two phase structure having the A-phase and the B-phase, however, three or more phases may be employed as long as a normalized induced voltage is generated from an induced voltage in each phase, then the thrust coefficient and the thrust ripple coefficient are calculated from the sum of results of multiplication by rectification values in the respective phases, and the thrust ripple correction coefficient and the thrust ripple correction table are generated.

Other Embodiment

Figure 11:
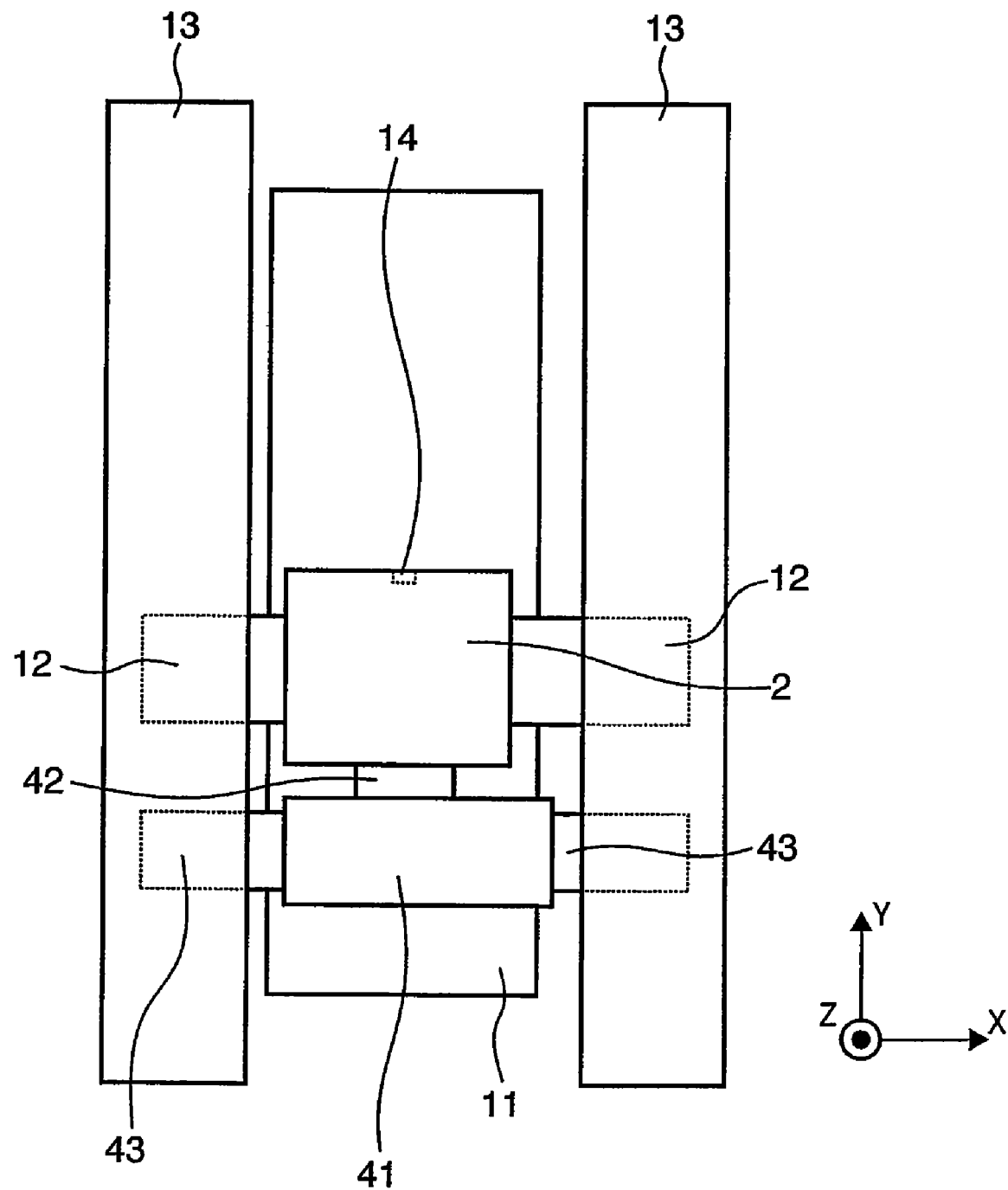
FIG. 11 is a top view showing the structure of the reticle stage according to another embodiment of the present invention.
Figure 12:
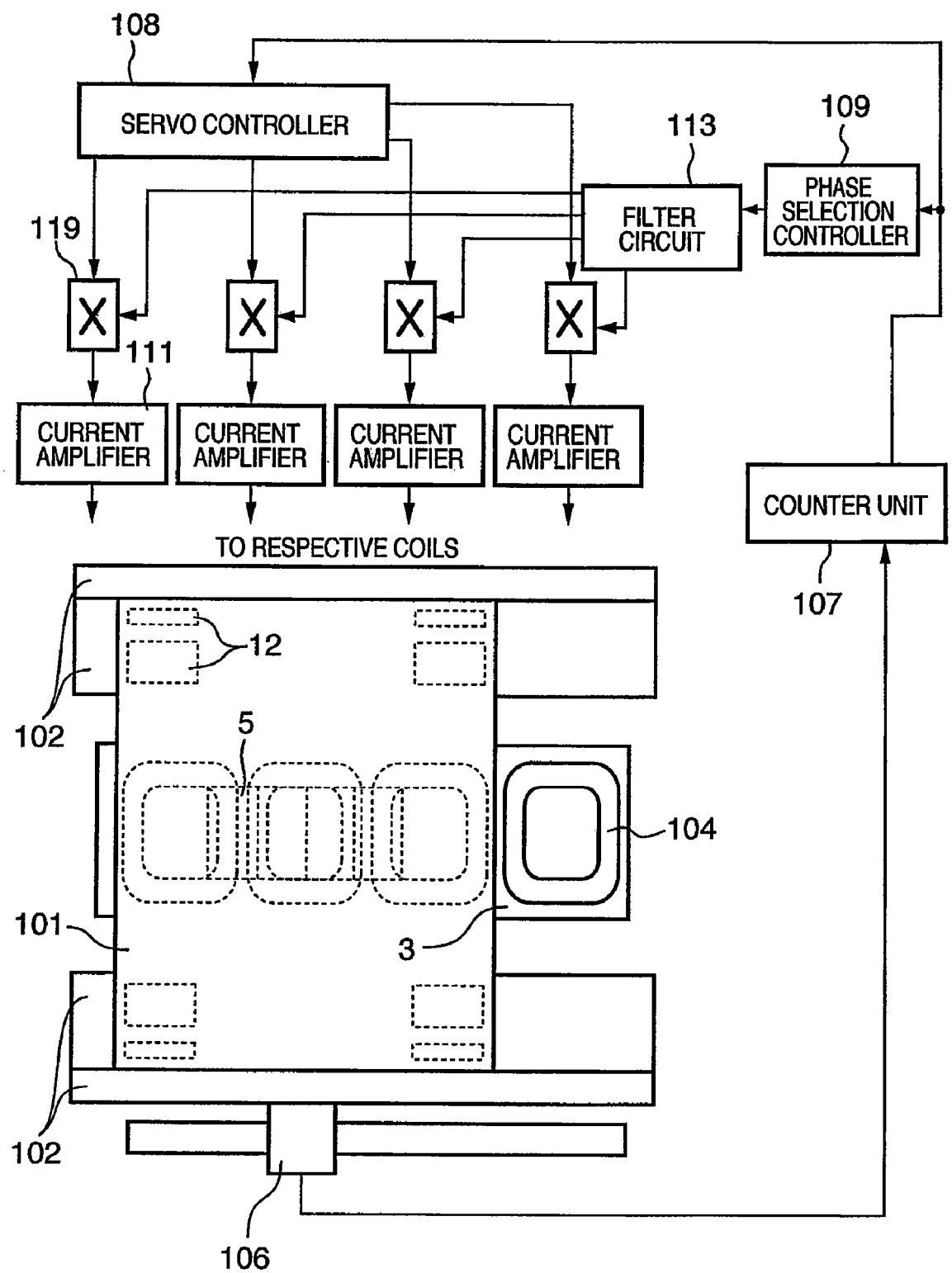
FIG. 12 is a block diagram showing an example of the construction of the stage apparatus for positioning of an object and its control system.

FIG. 11 is a top view showing the structure of the reticle stage according to another embodiment mounted in the exposure apparatus in FIG. 1. In FIG. 11, the same constituent elements as those in FIG. 2 have the same reference numerals.

In the linear motor, with respect to one stator 13, movable elements 12 and 43 are provided respectively for the reticle stage 2 and a sub stage 41. In the linear motor having this structure, the both stages are connected with a connecting member 42, and the selection switch as shown in FIG. 7 corresponding to one stage is connected to the current driver side, while the selection switch corresponding to the other stage is connected to the induced voltage inlet side. Then, a series of operations to drive the linear motor connected to the current driver side and generate the thrust ripple correction table from the induced voltage in the linear motor connected to the induced voltage inlet side are performed. Thereafter, the stage connected to the current driver side is connected to the induced voltage inlet side while the stage connected to the induced voltage inlet side is connected to the current driver side, and the thrust ripple correction table for the other stage is generated. As the connecting member 42, a member using electromagnetic force such as an electromagnet, a member utilizing a negative pressure force to atmospheric pressure such as a vacuum chuck, or a fixing member using bolt fastening may be used.

Further, in a case where two stages are not used, it may be arranged such that plural movable element units are provided for one stator in one stage to obtain a thrust force. In this case, the stage is driven with one or more of the movable elements, and the induced voltage corresponding to movable element(s) not driven in driving is measured and the subsequent processing is performed, thus the thrust ripple correction table is generated. Then, the stage is driven with the other movable element(s) such that the induced voltage corresponding to the movable element(s) previously used in driving is measured. In this arrangement, the thrust ripple correction table corresponding to each of the movable elements for the linear motor can be generated when it is incorporated in the apparatus, and drive control with corrected thrust ripple can be performed.

In the above embodiment, plural linear motors are provided for one stage or plural stages and movable elements are provided for one linear motor stator, however, only one linear motor may be provided for one stage. In this case, the selection switch is set to the current driver side or the induced voltage inlet side by phase. For example, in use of a linear motor by 2-phase (A-phase and B-phase) drive, first, the A-phase is set to the current driver side, then the B-phase is set to the induced voltage inlet side, and the stage is driven only with the A-phase. At this time, as it is understood from FIGS. 5A and 5B, the thrust is zero in a position in the driving only with the A-phase. When the stage is stopped in this position where the thrust in the A-phase is zero, the stage cannot be driven from the position. Accordingly, it is necessary to consider the stage stop position upon take-in of the induced voltage. As described above, for the measurement of induced voltage, a high stage speed is not necessary, and a somewhat uneven speed may be allowed as long as the position and speed of the stage can be measured. Once the stage begins to move, the stage passes through the position where the A-phase thrust is zero by the inertia of the stage, the driving for the induced voltage measurement can be performed without any problem only if the initial position and the stop position of the stage are checked. Then, when the thrust ripple correction table has been generated by the above-described series of calculations from the B-phase induced voltage measurement, the selection switch is changed so as to drive the stage by the B-phase, and the A-phase induced voltage measurement is performed. Then, the above-described series of calculations are made. In the case of the two-phase driving, there is a position where the thrust is zero upon driving only with one phase, however, in use of a three or more phase linear motor driven with two or more phases, as there is no position where the thrust is zero, it is not necessary to consider the stop position upon driving. In the three or more phase linear motor, the induced voltage measurement is sequentially performed and the thrust ripple correction table is calculated by phase. In this arrangement, even in a case where the number of movable elements is one, the thrust ripple correction table can be generated and drive control with corrected thrust ripple can be performed.

In the above description, the induced voltage is measured by driving the stage using a part of the linear motor. As described above, as the calculation of the thrust ripple correction table is basically performed only once upon starting of the apparatus, another driving unit may be provided. For example, another linear motor may be provided upon measurement, or driving may be performed with a robot hand. Manual driving is not inconceivable, however, as extreme speed unevenness may cause an error in calculation of normalized induced voltage, the manual driving is not preferable.

Further, it may be arranged such that prior to incorporation into the apparatus, upon assembly of a linear motor, the induced voltage is measured in another assembly measuring apparatus and the thrust ripple correction table is calculated, then the linear motor is incorporated in the exposure apparatus, and the thrust ripple correction table is inputted into the exposure apparatus. In this case, the thrust ripple correction table can be generated in other apparatus than the exposure apparatus.

Further, the present invention can be utilized for other purposes than the generation of the thrust ripple correction table. For example, the invention is applicable to an apparatus or method for detection of abnormality or trouble of a linear motor represented by coil breakage. In this case, the induced voltage data read from the induced voltage inlet shown in FIG. 7 is compared with previously experimentally obtained normal waveform data or the like, thereby abnormality or trouble such as breakage of coil or coil wiring, coil positional shift and demagnetization or positional shift of the magnet can be efficiently detected.

[Device Fabrication Method]

Next, a device fabrication method utilizing the above-described exposure apparatus will be described.

Figure 13:
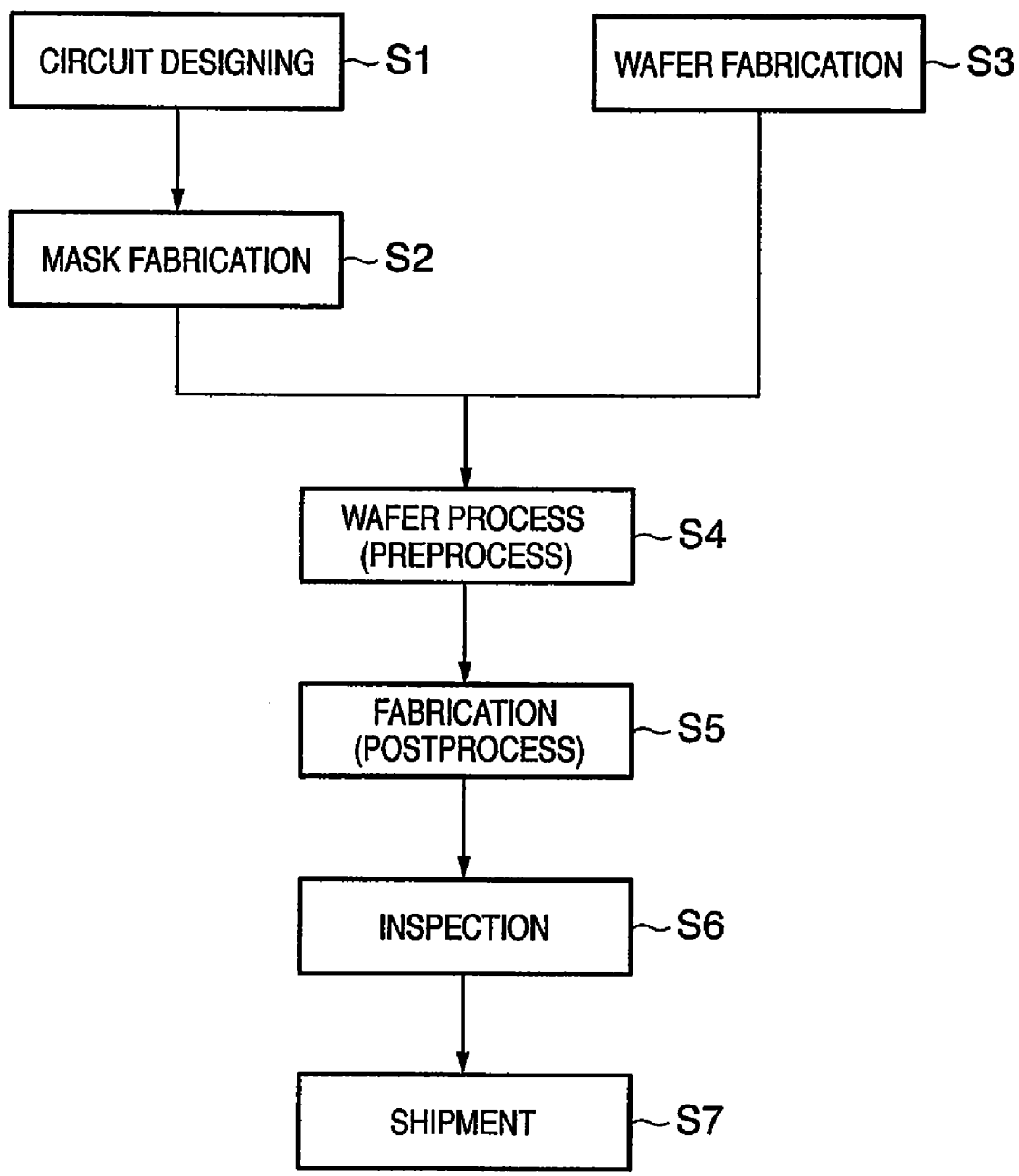
FIG. 13 is a flowchart showing a micro device fabrication flow.

FIG. 13 shows a micro device (semiconductor chip such as an IC or LSI, a liquid crystal panel, a CCD, a thin-film magnetic head, a micro machine or the like) fabrication flow. At step S1 (circuit designing), a semiconductor device circuit is designed. At step S2 (generation of exposure control data), exposure control data for the exposure apparatus is generated based on the designed circuit pattern. On the other hand, at step S3 (wafer fabrication), a wafer is fabricated by using material such as silicon. At step S4 (wafer process), called a preprocess, an actual circuit is formed on the wafer by a lithography technique using the exposure apparatus in which the above exposure control data has been inputted and the wafer. At the next step S5 (fabrication), called a post process, a semiconductor chip is fabricated by using the wafer fabricated at step S4. Step S5 includes an assembly process (dicing and bonding), a packaging process (chip encapsulation) and the like. At step S6 (inspection), inspections such as an operation check, a durability test and the like are performed on the semiconductor device formed at step 5. The semiconductor device is completed through these processes, and is shipped (step S7).

Figure 14:
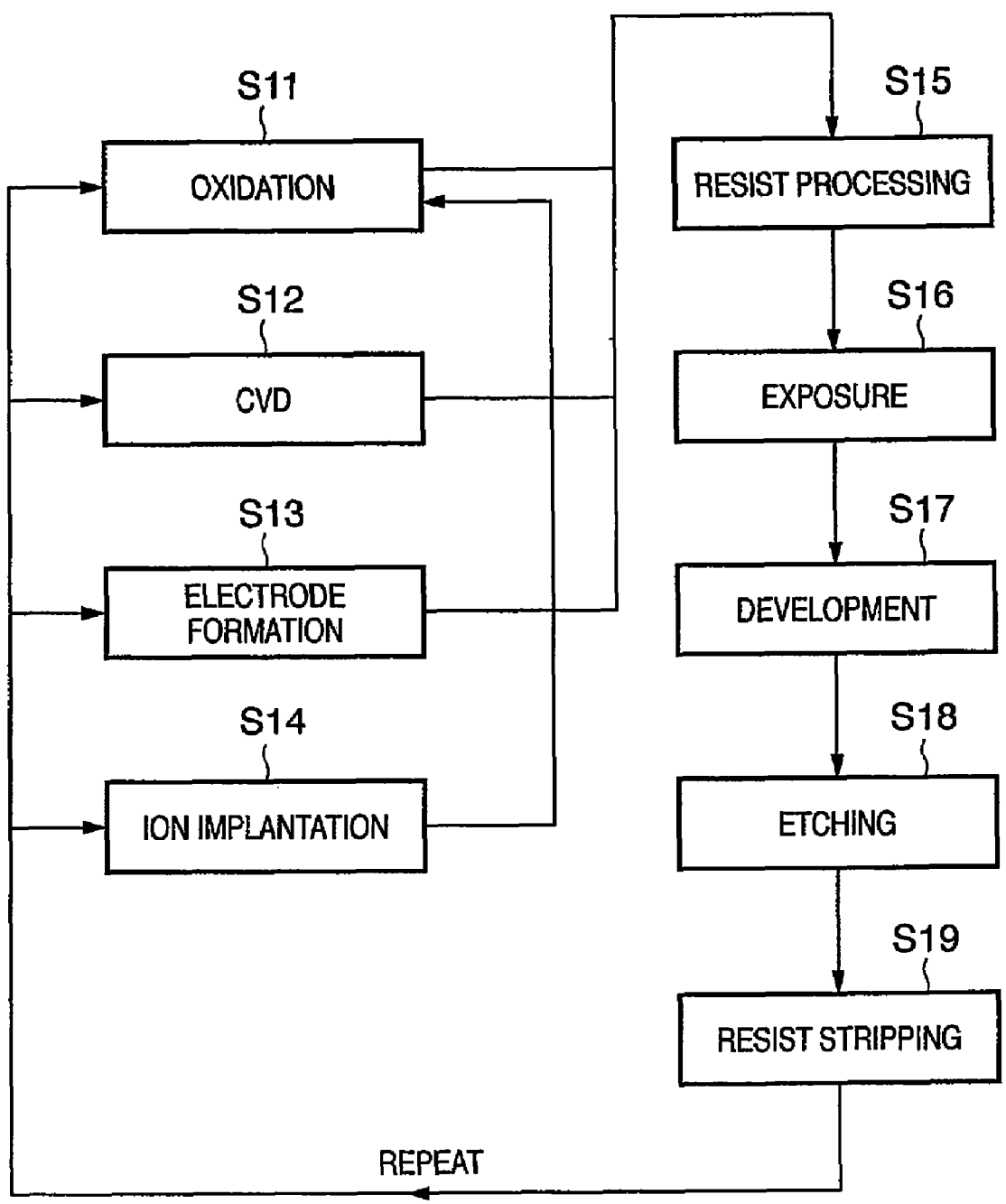
FIG. 14 is a flowchart showing a wafer process.

FIG. 14 shows the detailed flow of the wafer process. At step S11 (oxidation), the surface of the wafer is oxidized. At step S12 (CVD), an insulating film is formed on the surface of the wafer. At step S13 (electrode formation), electrodes are formed by vapor deposition on the wafer. At step S14 (ion implantation), ions are injected in the wafer. At step S15 (resist processing), the wafer is coated with photoresist. At step S16 (exposure), the circuit pattern is exposure-printed on the wafer by the above-described exposure apparatus. At step S17 (development), the exposed wafer is developed. At step S18 (etching), other portions than the developed resist are removed. At step S19 (resist stripping), the resist which is unnecessary after the completion of etching is removed. These steps are repeated, to form a multiple layers of circuit patterns on the wafer.

According to the embodiments, as the thrust ripple coefficient can be obtained based on the induced voltage of the linear motor, a pure thrust ripple without influence such as disturbance can be obtained. As the correction is performed using the thrust ripple correction table generated from the thrust ripple upon stage driving, even there is a thrust ripple in the linear motor, excellent positioning control can be performed as if there is no thrust ripple.

Further, as the correction value calculated from the thrust ripple correction table is equal to or less than "1.0", the command to the current driver can be reliably converged between limit values by management of the command to the current driver before correction. Further, the thrust ripple correction table can be generated for the respective movable elements of the linear motor when the motor is incorporated in the apparatus, and drive control can be performed with the corrected thrust ripple.

Further, even in a case where the number of movable elements is one, the thrust ripple correction table can be generated and drive control with corrected thrust ripple can be performed. Further, the thrust ripple correction table can be generated without the apparatus.

Further, trouble such as coil breakage or its positional shift, magnet demagnetization or its positional shift can be efficiently detected by examining the induced voltage data.

The present invention is not limited to the above embodiments and various changes and modifications can be made within the spirit and scope of the present invention. Therefore, to appraise the public of the scope of the present invention, the following claims are made.

This application claims the benefit of Japanese Patent Application No. 2005-023931, filed Jan. 31, 2005, which is hereby incorporated by reference herein in its entirety.

What is claimed is:

1. A moving control apparatus comprising:
   a moving member provided movably at least in one direction;
   a driver having a movable element connected to said moving member and a stator to displace the movable element;
   a controller which energizes said driver to cause said movable element to generate a thrust;
   a position detector which detects a relative position between the movable element and the stator in said driver;
   a measurement unit which drives the movable element of said driver and measures an induced voltage generated in said driver; and
   a correction calculator which calculates a thrust ripple correction value to correct a thrust ripple as a variation of a thrust generated in said driver from the measured induced voltage and the relative position in said driver, and multiplies a command to said driver by the correction value.

2. The moving control apparatus according to claim 1, wherein said driver is a multi-phase linear motor having a magnet as said movable element and a coil as said stator,
   and wherein said measurement unit measures the induced voltage generated in a second-phase coil when a first-phase coil is energized in said driver.

3. The moving control apparatus according to claim 1, wherein said driver has plural movable elements with respect to one stator,
   and wherein said measurement unit measures the induced voltage generated by a second movable element when a first movable element is driven in said driver.

4. The moving control apparatus according to claim 1, wherein said driver has a first driving element and a second driving element,
   and wherein said measurement unit measures the induced voltage generated in said second driving unit when said first driving unit is driven.

5. The moving control apparatus according to claim 1, wherein said measurement unit has a selector which selects a status to drive said driver by said controller and a status not to drive said driver by said controller.

6. The moving control apparatus according to claim 1, wherein said correction calculator generates a correction table from said thrust ripple correction value.

7. The moving control apparatus according to claim 1, wherein said correction calculator calculates a thrust ripple coefficient using a value obtained by dividing said induced voltage by a moving speed at that time, and calculates a reciprocal of a value obtained by dividing the thrust ripple coefficient by its mean value, as said thrust ripple correction value.

8. The moving control apparatus according to claim 7, wherein said thrust ripple correction value is equal to or less than 1.0.

9. A moving control method for a moving control apparatus, having a moving member provided movably at least in one direction and a driver having a movable element connected to said moving member and a stator to displace the movable element, wherein said driver is energized to cause said movable element to generate a thrust, comprising:
   a position detection step of detecting a relative position between the movable element and the stator in said driver;
   a measurement step of driving the movable element of said driver and measuring an induced voltage generated in said driver; and
   a correction calculation step of calculating a thrust ripple correction value to correct a thrust ripple as a variation of a thrust generated in said driver from the measured induced voltage and the relative position in said driver, and multiplies a command to said driver by the correction value.

10. An exposure apparatus for exposure of a pattern on an original plate to a substrate,
    wherein relative positioning of said original plate and said substrate is performed using the moving control apparatus in claim 1, and exposure is performed.

11. A device fabrication method for fabricating a device using the exposure apparatus in claim 10.

12. An abnormality detection apparatus comprising:
    a moving member provided movably at least in one direction;
    a driver having a movable element connected to said moving member and a stator to displace the movable element;
    a controller which energizes said driver to cause said movable element to generate a thrust;
    a measurement unit which drives the movable element of said driver and measures an induced voltage generated in said driver; and
    a detector which detects an abnormality using the result of measurement by said measurement unit.

13. An abnormality detection method for an apparatus, having a moving member provided movably at least in one direction and a driver having a movable element connected to said moving member and a stator to displace the movable element, and a controller which energizes said driver to cause said movable element to generate a thrust, comprising:
    a measurement step of driving the movable element of said driver and measuring an induced voltage generated in said driver; and
    a detection step of detecting an abnormality using the result of measurement at said measurement step.

* * * * *